United States Patent
An et al.

(10) Patent No.: US 9,330,768 B2
(45) Date of Patent: May 3, 2016

(54) SEMICONDUCTOR MEMORY DEVICE, MEMORY SYSTEM INCLUDING THE SAME AND OPERATING METHOD THEREOF

(71) Applicant: SK hynix Inc., Icheon-si Gyeonggi-do (KR)

(72) Inventors: Chi Wook An, Icheon-si (KR); Min Kyu Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 146 days.

(21) Appl. No.: 14/261,083

(22) Filed: Apr. 24, 2014

(65) Prior Publication Data

US 2015/0155041 A1    Jun. 4, 2015

(30) Foreign Application Priority Data

Dec. 2, 2013  (KR) .................. 10-2013-0148723

(51) Int. Cl.
*G11C 16/06* (2006.01)
*G11C 16/10* (2006.01)
*G11C 16/34* (2006.01)
*G11C 11/56* (2006.01)

(52) U.S. Cl.
CPC ............ G11C 16/10 (2013.01); G11C 11/5628 (2013.01)

(58) Field of Classification Search
CPC ........... G11C 16/0483; G11C 16/3459; G11C 16/10; G11C 16/14; G11C 16/04; G11C 16/34; G11C 16/3468
See application file for complete search history.

(56) References Cited

U.S. PATENT DOCUMENTS

2010/0074011 A1* 3/2010 Kang ................. G11C 11/5628
                                                        365/185.03
2014/0269057 A1* 9/2014 Shereshevski ......... G11C 16/10
                                                        365/185.03

FOREIGN PATENT DOCUMENTS

KR              100816220 B1    3/2008
KR          1020090112082 A    10/2009

* cited by examiner

*Primary Examiner* — Hien Nguyen
(74) *Attorney, Agent, or Firm* — William Park & Associates Ltd.

(57) ABSTRACT

A semiconductor memory device, a memory system including the same and an operating method thereof are set forth. The semiconductor memory device includes a memory cell array having a plurality of memory cells, peripheral circuits configured to perform a program operation using an incremental step pulse programming (ISPP) method on selected memory cells from among the plurality of memory cells. The semiconductor memory device includes an additional program using set program voltages to set memory cells, and a control logic configured to control the peripheral circuits to perform the program in the manner of the ISPP method and the additional program.

19 Claims, 6 Drawing Sheets

SEMICONDUCTOR MEMORY DEVICE, MEMORY SYSTEM INCLUDING THE SAME AND OPERATING METHOD THEREOF

CROSS-REFERENCE TO RELATED APPLICATION

The present application claims priority to Korean patent application number 10-2013-0148723 filed on Dec. 2, 2013, in the Korean Intellectual Property Office, the entire disclosure of which is incorporated by reference herein.

BACKGROUND

1. Technical Field

The invention relates to a semiconductor memory device, a memory system including the same and an operating method thereof.

2. Related Art

A semiconductor memory device may be a memory device implemented using a semiconductor such as, for example, silicon (Si), germanium (Ge), gallium arsenide (GaAs), indium phosphide (InP), etc. For example, the semiconductor memory device described above can be generally classified as a volatile memory device or a nonvolatile memory device.

A volatile memory device is a memory device in which data stored therein is erased when a power supply is cut off. Volatile memory devices may include a static random access memory (SRAM), a dynamic RAM (DRAM), a synchronous DRAM (SDRAM), etc. A nonvolatile memory device is a memory device in which data stored therein is retained even when the power supply is cut off. Nonvolatile memory devices include a read only memory (ROM), a programmable ROM (PROM), an electrically programmable ROM (EPROM), an electrically erasable and programmable ROM (EEPROM), a flash memory, a phase-change RAM (PCRAM), a magnetic RAM (MRAM), a resistive RAM (ReRAM), a ferroelectric RAM (FeRAM), etc. Moreover, flash memories are widely classified into a NOR-type and a NAND-type.

A flash memory device may be classified as a 2-dimensional semiconductor device in which strings are formed on a semiconductor substrate in a horizontal direction, and as a 3-dimensional semiconductor device in which strings are formed on a semiconductor substrate in a vertical direction.

The 3-dimensional semiconductor device is a memory device developed to overcome a limitation of a degree of integration of the 2-dimensional semiconductor device, and thus includes a plurality of strings formed in a vertical direction on the semiconductor substrate. The strings may include a drain select transistor, memory cells and a source select transistor connected in series between a bit line and a source line.

SUMMARY

An embodiment sets forth a semiconductor memory device having a memory cell array including a plurality of memory cells and peripheral circuits. The peripheral circuits may be configured to perform a program operation using an incremental step pulse programming (ISPP) method on selected memory cells from among the plurality of memory cells. Further, the peripheral circuits may be configured to perform an additional program operation using set program voltages on set memory cells. The semiconductor device set forth by the embodiment may also have a control logic configured to control the peripheral circuits to perform the program operation using the ISPP method and the additional program operation.

An embodiment sets forth a memory system having a semiconductor memory device configured to store program data and a controller configured to receive a command from a host and to control a program operation of the semiconductor memory device. The semiconductor memory device performs a program operation using an ISPP method and an additional program operation on set memory cells using set program voltages to store the program data.

An embodiment sets forth an operating method of a semiconductor memory device. The method may include applying program voltages to selected memory cells, and performing a program operation using an ISPP method to perform a program verification operation. The method may also include controlling a potential level of a bit line of set memory cells among the selected memory cells when the program operation using the ISPP method ends, and performing an additional program operation to apply set program voltages to the set memory cells. The set program voltages are program voltages applied when a threshold voltage of a majority of the memory cells is increased to a target threshold voltage from among a plurality of program voltages used in the program operation using the ISPP method. Further, the set memory cells are memory cells that are changed from program fail to program pass when the program operation using the ISPP method is performed and the program voltages having the same potential levels as the set program voltages are applied.

BRIEF DESCRIPTION OF THE DRAWINGS

That described above, as well as various other features and advantages of the present invention will become more apparent to those of ordinary skill in the art in describing in detail several embodiments thereof with reference to the attached drawings in which.

DETAILED DESCRIPTION

Advantages and features of the present invention, and implementation methods thereof will be further clarified through following various embodiments described below along with reference to the accompanying drawings. The present invention may, however, be embodied in different forms and should not be construed as limited to the embodiments set forth herein. Hereinafter, various embodiments of the present invention will be described in further detail such that a person ordinarily skilled in the art may make and use the invention.

As used in this disclosure below, when one part is referred to as being "connected" to another part, it should be understood that the former can be "directly connected" to the latter, or "indirectly connected" to the latter via an intervening part.

Figure 1:
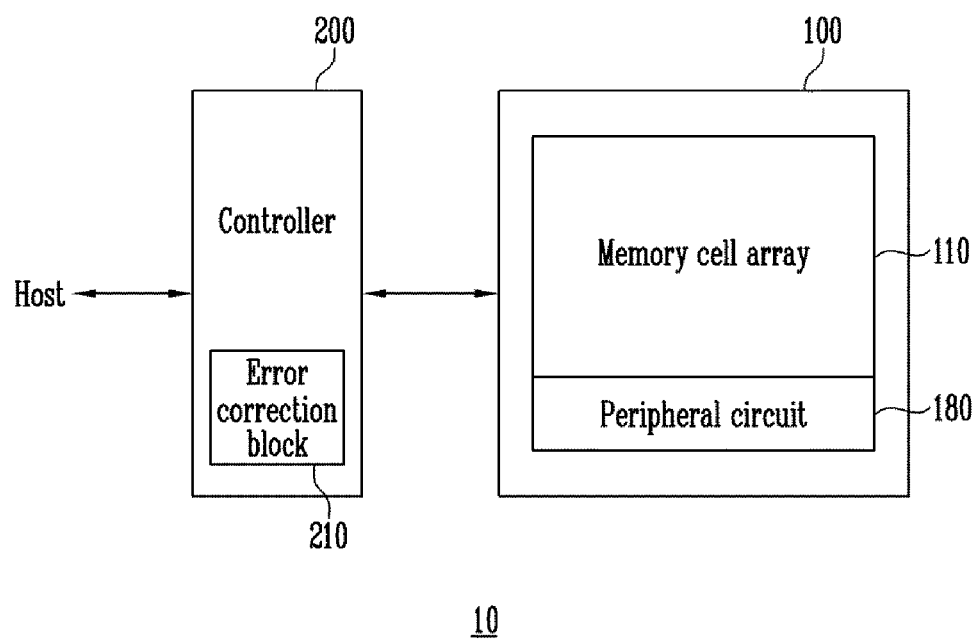
FIG. 1 is a block diagram showing a memory system including a semiconductor memory device.

Referring to FIG. 1, the memory system 10 includes the semiconductor memory device 100 and a controller 200. The semiconductor memory device 100 may include a memory cell array 110, and a peripheral circuit 180. The peripheral circuit 180 is electrically connected to the memory cell array 110.

The memory cell array 110 includes a plurality of memory cells. Each cell from the plurality of memory cells is defined as a multi-level memory cell capable of storing two or more data bits.

The semiconductor memory device 100 operates in response to control signals of the controller 200. When the semiconductor memory device 100 receives a program command provided from the controller 200, the semiconductor memory device 100 is configured to perform a program operation on the memory cells (i.e., selected memory cells) indicated by an address received together with the program command. Here, when the program operation is performed, the semiconductor memory device 100 may perform a program operation using an incremental step pulse programming (ISPP) method, and then additionally applies a set program voltage preset in advance to set memory cells among the memory cells, thereby performing the program operation. Here, the set program voltage may be a program voltage applied when a threshold voltage of a majority of the memory cells is increased to at least a target threshold voltage from among a plurality of program voltages used in the program operation using the ISPP method. Further, the set program voltage may be a program voltage applied when a threshold voltage of a majority of the memory cells from among a plurality of program voltages is increased to a target threshold voltage or higher, and a next program voltage increased by a step voltage from the program voltage. The set program voltage may be additionally applied one time or the number of set times to the memory cells. In addition, when the program operation using the ISPP method is performed and the program voltage has the same potential level as the set program voltage that is applied, the selected memory cells are memory cells for which the threshold voltage is determined to increase from program fail to program pass.

In an embodiment, the semiconductor memory device 100 may also include a flash memory device. However, it will be understood that technical aspects of the present invention are not limited to the flash memory device.

The controller 200 is electrically connected between the semiconductor memory device 100 and a host (Host). The controller 200 is configured to interface between the host (Host) and the semiconductor memory device 100. For example, when a read or program operation is performed based on a request from the host (Host), the controller 200 may convert a logical block address received from the host (Host) to a physical block address, and provide the converted physical block address together with a corresponding command to the semiconductor memory device 100. Information about the set program voltage may be transmitted to the semiconductor memory device 100 when the program operation is performed.

As an embodiment, the controller 200 may include an error correction block 210. The error correction block 210 is configured to detect and correct an error of data received from the semiconductor memory device 100. An error correction function performed by the error correction block 210 is limited by the number of error bits of data received from the semiconductor memory device 100. When the number of error bits among the data received from the semiconductor memory device 100 is smaller than a predetermined value, the error correction block 210 performs error detection and correction functions. When the number of error bits among the data received from the semiconductor memory device 100 is greater than the predetermined value, the error correction block 210 may not perform the error detection and correction functions. When the error detection and correction functions cannot be performed, the controller 200 controls the semiconductor memory device 100 to control a read voltage applied to a selected word line.

Figure 2:
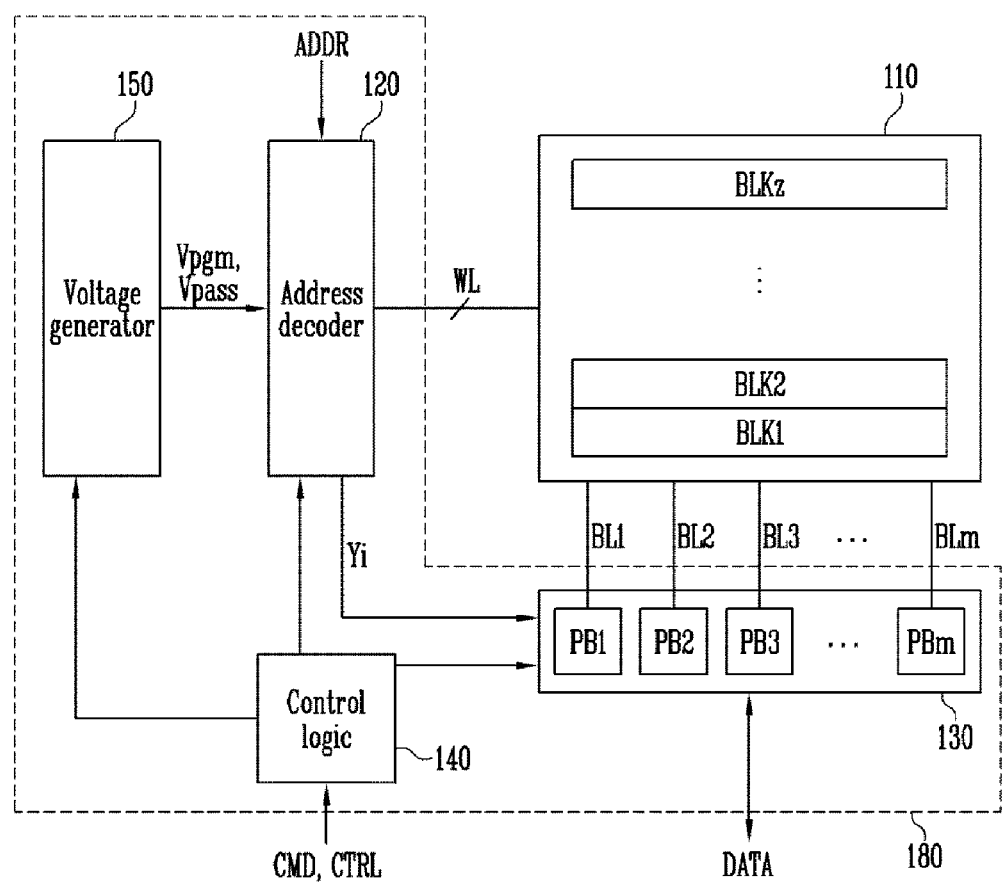
FIG. 2 is a block diagram showing the semiconductor memory device of FIG. 1 in detail.

Referring to FIG. 2, the, semiconductor memory device 100 includes the memory cell array 110 and the peripheral circuit 180 having an address decoder 120, a read and write circuit 130, a control logic 140, and a voltage generator 150.

The memory cell array 110 includes a plurality of memory blocks BLK1 to BLKz. The plurality of memory blocks BLK1 to BLKz is electrically connected to the address decoder 120 through word lines WL. Further, the plurality of memory blocks BLK1 to BLKz is electrically connected to the read and write circuit 130 through bit lines BL1 to BLm. Each of the plurality of memory blocks BLK1 to BLKz includes a plurality of memory cells. In an embodiment, the plurality of memory cells may include nonvolatile memory cells. The memory blocks BLK1 to BLKz may include a plurality of the pages. The page may be composed of the plurality of memory cells connected to the same word line.

The address decoder 120 is electrically connected to the memory cell array 110 through the word lines WL. The address decoder 120 is configured to operate in response to control of the control logic 140. The address decoder 120 receives an address ADDR through an input/output buffer (not shown) in the semiconductor memory device 100. That is, the controller 200 may provide the address ADDR to the input/output buffer, and the address ADDR buffered in the input/output buffer may be input to the address decoder 120. (Refer to FIG. 1).

The address decoder 120 decodes a row address among the received addresses ADDR when the program operation is performed, applies a program voltage Vpgm generated from the voltage generator 150 to selected word lines among the plurality of word lines WL based on the decoded row address, and applies a pass voltage Vpass to the remaining unselected word lines.

The address decoder 120 decodes a column address among the received addresses ADDR. The address decoder 120 transmits the decoded column addresses Yi to the read and write circuit 130.

The program operation of the semiconductor memory device 100 may be performed in units of pages. The address ADDR received when read and program operations are requested includes the block address, the row address and the column address. The address decoder 120 selects one memory [page] and one word line based on the block address and the row address. The column address is decoded by the address decoder 120 and provided to the read and write circuit 130.

The address decoder 120 may include a block decoder, a row decoder, a column decoder and an address buffer.

The read and write circuit 130 includes a plurality of page buffers PB1 to PBm. The plurality of page buffers PB1 to PBm is electrically connected to the memory cell array 110 through the bit lines BL1 to BLm. Each of the plurality of page buffers PB1 to PBm receives and temporarily stores program data when the program operation is performed, and controls a potential level of a corresponding bit line to be a program permission voltage or program prohibition voltage based on the program data. In addition, when a program verification operation is performed, each of the plurality of page buffers PB1 to PBm senses a program state of a corresponding memory cell, compares the program state with the temporarily stored program data when the program operation is performed, and verifies whether the corresponding memory cell is programmed. When the program voltage having the same potential level as the set program voltage is applied, each of the plurality of page buffers, PB1 to PBm, may determine the memory cells for which a threshold voltage of the memory cells is increased from program fail to program pass. Such memory cells may be identified as the set memory cells. The application of the program voltage may occur while the program operation using the ISPP method is performed. The plurality of page buffers may and store information about the set memory cells in a latch in a page buffer. Then, when an operation for the application of an additional set program voltage is performed, each of the plurality of page buffers PB1 to PBm controls a potential level of the bit line based on whether the corresponding memory cell, according to the information stored in the latch, is the set memory cell or not. Each of the plurality of page buffers PB1 to PBm may be controlled such that only the set memory cells are additionally programmed.

The read and write circuit 130 operates in response to control of the control logic 140.

In an embodiment, the read and write circuit 130 may include the page buffers or page registers, a column selecting circuit, etc.

The control logic 140 is connected to the address decoder 120, the read and write circuit 130, and the voltage generator 150. The control logic 140 receives a command CMD through an input/output buffer (not shown) of the semiconductor memory device 100. The command CMD may be buffered in the input/output buffer. The buffered command CMD may be provided from the controller 200 (Refer to FIG. 1). The control logic 140 controls overall operations of the semiconductor memory device 100 in response to the command CMD. In addition, when the program operation is performed, the control logic 140 controls the address decoder 120, the read and write circuit 130 and the voltage generator 150 to end the program operation using the ISPP method. Further, the control logic 140 controls the address decoder 120, the read and write circuit 130 and the voltage generator 150 to perform the additional program operation on the set memory cells using information about the set program voltage received from the controller 200.

The voltage generator 150 is configured to generate the program voltage Vpgm and the pass voltage Vpass when the program operation is performed. The voltage generator 150 may generate a plurality of sequentially increasing program voltages Vpgm according to control of the control logic 140 when the program operation using the ISPP method is performed, and output the set program voltage according to control of the control logic 140 when the additional set program voltage is applied.

Figure 3:
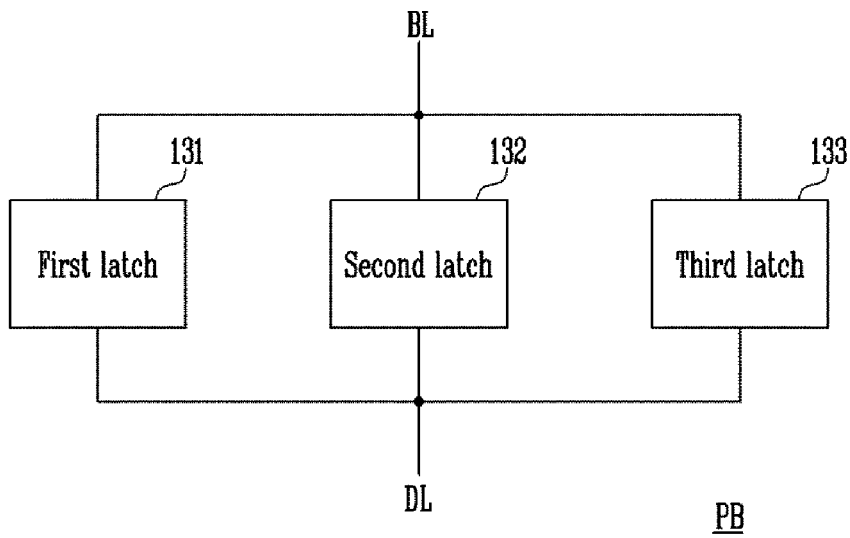
FIG. 3 is a block diagram showing one of page buffers of FIG. 2.
Figure 4:
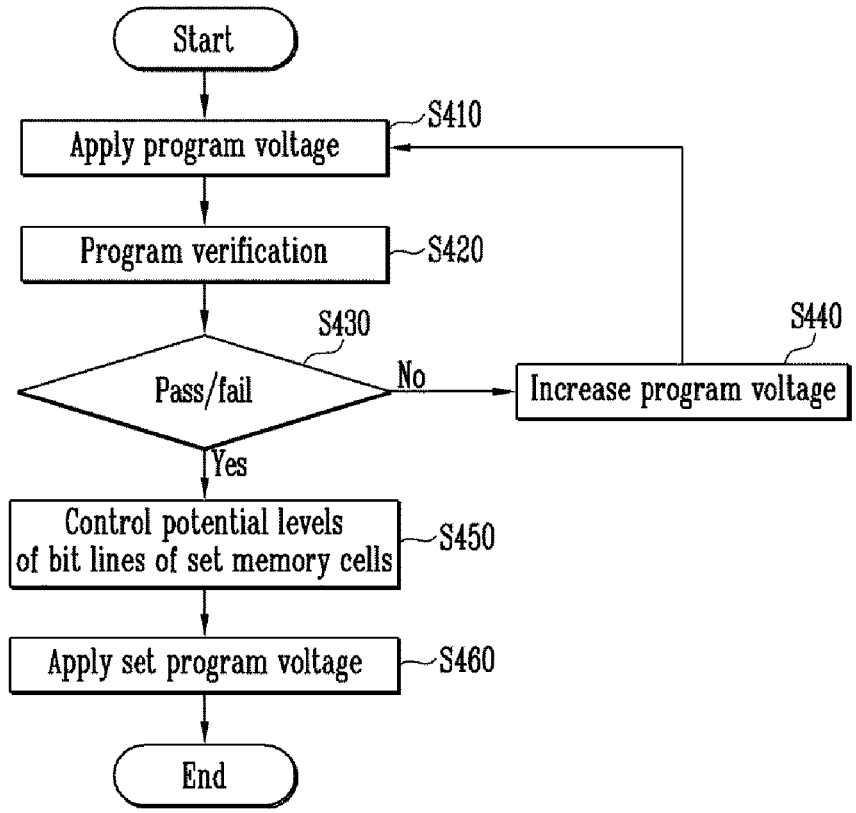
FIG. 4 is a sequence diagram illustrating operations of a semiconductor memory device according to embodiments of the present invention.

FIG. 3 is a block diagram showing one of the page buffers of FIG. 2.

Referring to FIG. 3, the page buffer PB may include a plurality of latches. For example, the page buffer PB of the embodiment includes a first latch 131, a second latch 132 and a third latch 133. The first to third latches 131 to 133 are electrically connected in parallel between a bit line BL and a data line DL.

When a program operation is performed, program data input through the data line DL is temporarily stored in the first latch 131 and transmitted to the second latch 132. The program data remains in the first latch 131. When the program operation is performed based on the program data stored in the second latch 132, a potential level of the bit line BL is controlled to a program permission voltage (e.g., 0 V) or a program prohibition voltage (e.g., VCC). When a program verification operation is performed, a state of a memory cell sensed through the bit line BL is transmitted to the first latch 131 in which the program data remains, and it is verified whether the memory cell is programmed or not by comparing the remaining program data with the state of the sensed memory cell. When the program verification operation is performed after applying a program voltage substantially equal to the program voltage set while the program verification operation is performed. At that time, information about the memory cells is determined as program pass and further classified as the set memory cells among the memory cells program. Moreover, the information is verified by the first latch 131 and transmitted to the third latch 133 to be stored therein. When an additional program operation that applies the set program voltage is performed after a program operation using an ISSP method ends, information of the set memory cells stored in the third latch 133 is transmitted to the second latch 132 and the bit line of the set memory cells is controlled by the program permission voltage.

Referring to FIGS. 1 to 5, operations of the semiconductor memory device according to an embodiment are described as follows.

1) Apply Program Voltage (S410)

Program data is input into and temporarily stored in each of the page buffers PB1 to PBm of the read and write circuit 130, and the potential level of the bit lines BL1 to BLm is controlled to the program permission voltage level or program prohibition voltage level based on the temporary stored program data. Then, the voltage generator 150 generates the program voltage Vpgm and the pass voltage Vpass based on control of the control logic 140. Here, the program voltage Vpgm is a start program voltage having the lowest potential level among the plurality of program voltages. The program voltage Vpgm generated from the voltage generator 150 is applied to selected word lines among a plurality of word lines by the address decoder 120, and the pass voltage Vpass is applied to unselected word lines among the plurality of word lines by the address decoder 120.

2) Verify Program (S420)

After the program voltage is applied for a given time, the voltage generator 150 generates a verification voltage based on control of the control logic 140, and the verification voltage is applied to the selected word line among the plurality of word lines by the address decoder 120.

Each of the page buffers PB1 to PBm of the read and write circuit 130 senses program states of the selected memory cells through the bit lines BL1 to BLm.

3) Determine Pass/Fail (S430)

As a result of the program verification operation (S420), program pass is determined when it is determined that program states of the sensed memory cells are higher than the target threshold voltage, and program fail is determined when it is determined that the program states of the sensed memory cells are lower than the target threshold voltage. Further, the program prohibition voltage is applied to the bit line of the memory cells determined as program pass.

4) Increase Program Voltage (S440)

When the number of the memory cells determined as program fail in the pass/fail determination (S430) is one or more, it is determined that the program voltage Vpgm applied in applying the program voltage (S410) is the final program voltage that has the highest potential level among the program voltages. When the program voltage is the final program voltage, the program operation using the ISPP method ends. When the program voltage is not the final program voltage, operations are retried from the operation of applying the program voltage (S410). Here, operations are retried after a new program voltage where the new program voltage is increased by a step potential level is set (S440).

5) Control Potential Levels of Bit Lines of Set Memory Cells (S450)

When all the memory cells are determined as program pass in the pass/fail determination (S430), the program permission voltage is applied to the bit lines of the set memory cells to perform an additional program operation on the set memory cells, and the program prohibition voltage is applied to the bit lines of the remaining memory cells.

The set memory cells are defined as the memory cells for which the threshold voltage is determined to increase from program fail to program pass when the program voltage having the same potential level as the set program voltage (while the program operation using the ISPP method is performed) is applied. Further, information about the memory cells determined as the set memory cells is stored in the latch of the page buffers.

An additional program verification operation is performed on the set memory cells, and the memory cells having a higher threshold voltage value than the target threshold voltage among the set memory cells may be excluded before the operation of controlling potential levels of the bit lines of set memory cells (S450) described above. However, the additional program verification operation can be omitted to reduce the overall time of program operations.

6) Apply Set Program Voltage (S460)

The set program voltage may be a program voltage applied when the threshold voltage of the majority of the memory cells is increased to a target threshold voltage or higher among a plurality of program voltages used in the program operation using the ISPP method.

Figure 5:
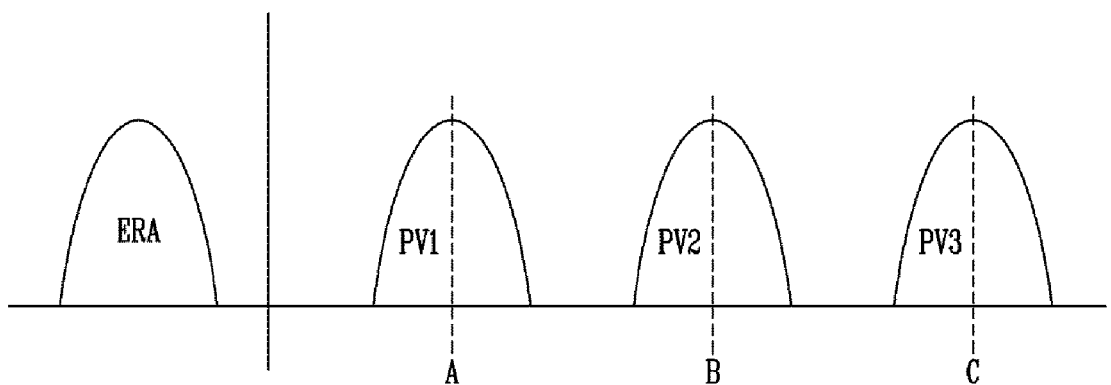
FIG. 5 is a graph showing distribution of threshold voltages of memory cells.

Referring to FIG. 5, the program voltages corresponding to the threshold voltages A, B and C distributed by the majority of memory cells among the program states in a threshold voltage distribution of a plurality of program states PV1, PV2 and PV3 are set as the set program voltages. The set program voltage may be based on data values taken from repetitive experiments on the general assumption that each memory device has similar characteristics.

Furthermore, the set program voltage may be a program voltage applied when the threshold voltage of the majority of memory cells among the plurality of program voltages is increased to the target threshold voltage or higher, and the next program voltage in which the program voltage is increased by a step voltage. The set program voltage additionally applied thereto may be applied only one time or, alternatively, the number of set times.

According to another embodiment, when the program operation of the semiconductor memory device is performed, the program voltages having the threshold voltages of majority of the memory cells are increased from program fail to program pass. The threshold voltages increased to program pass are set as the set program voltage. Further, the additional program operation is performed to increase the threshold voltage by also applying the set program voltage to the memory cells (programmed from program fail to program pass) by the same program voltage as the set program voltage. Therefore, when the plurality of memory cells are determined as program pass at a specific program voltage during the program operation, an under program phenomenon in which the threshold voltage is programmed to a lower level than the target threshold voltage may be mitigated.

Figure 6:
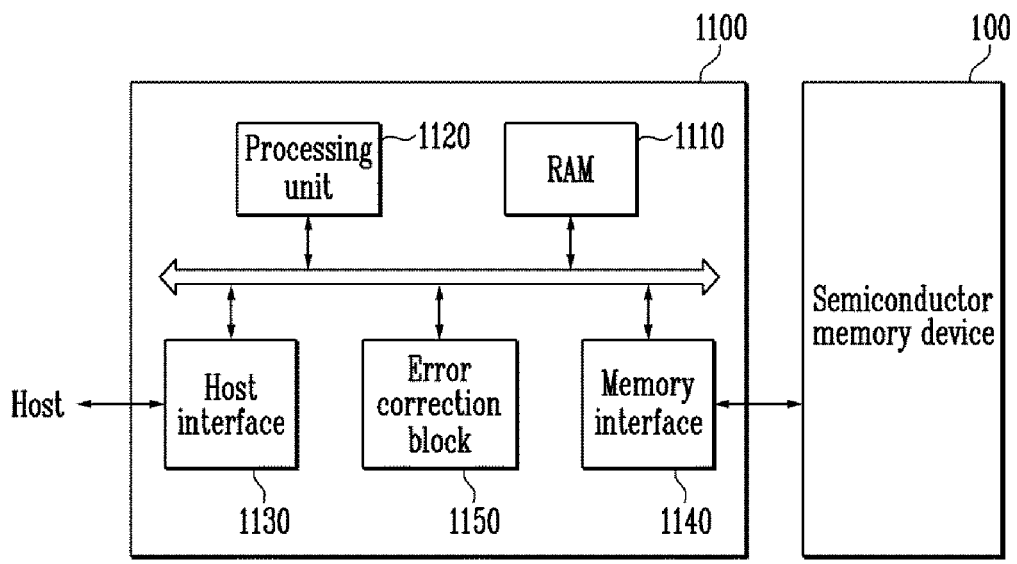
FIG. 6 is a block diagram showing a memory system including the semiconductor memory device of FIG. 1.

FIG. 6 is a block diagram showing a memory system including the semiconductor memory device of FIG. 1.

Referring to FIG. 6, the memory system 1000 includes a semiconductor memory device 100 and a controller 1100.

The semiconductor memory device 100 is configured and operates as described with reference to FIG. 1. Thus, duplicate descriptions will be omitted herein.

The controller 1100 includes a function of the controller 200 described with reference to FIG. 1. The controller 1100 is connected to a host Host and the semiconductor memory device 100. The controller 1100 is configured to access the semiconductor memory device 100 in response to a request from the host Host. For example, the controller 1100 is configured to control read, write, erase and background operations of the semiconductor memory device 100. The controller 1100 is configured to provide interfacing between the semiconductor memory device 100 and the host Host. Also, the controller 1100 is configured to drive firmware in order to control the semiconductor memory device 100.

The controller 1100 includes a random access memory (RAM) 1110, a processing unit 1120, a host interface 1130, a memory interface 1140 and an error correction block 1150. The RAM 1110 is used as at least one of an operating memory of the processing unit 1120, a cache memory between the semiconductor memory device 100 and the host Host, and a buffer memory between the semiconductor memory device 100 and the host Host. The processing unit 1120 controls overall operations of the controller 1100. In addition, the controller 1100 may temporarily store program data provided from the host Host during a write operation.

The host interface 1130 includes a protocol for performing data exchange between the host Host and the controller 1100. In an embodiment, the controller 1100 is configured to communicate with the host Host through at least one of various protocols, including, but not limited to, a Universal Serial Bus (USB) protocol, a MultiMediaCard (MMC) protocol, a Peripheral Component Interconnect (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, a private protocol, and so forth.

The memory interface 1140 interfaces with the semiconductor memory device 100. For example, the memory interface 1140 includes a NAND-interface or NOR-interface.

The error correction block 1150 has the same function as the error correction block 210 of FIG. 1. The error correction block 1150 detects and corrects a data error received from the semiconductor memory device 100 using an error correction code (ECC). The processing unit 1120 adjusts a read voltage according to the result of error detection of the error correction block 1150, and controls the semiconductor memory device 100 to perform a reread operation. In an embodiment, the error correction block 1150 may be provided as a component of the controller 1100.

The controller 1100 and the semiconductor memory device 100 may be integrated as one semiconductor device. In an embodiment, the controller 1100 and the semiconductor memory device 100 may be integrated as one semiconductor device to configure a memory card. For example, the controller 1100 and the semiconductor memory device 100 may be integrated as one semiconductor device to configure a memory card, including, but not limited to, a PC card (Personal Computer Memory Card International Association (PCMCIA)), a CompactFlash (CF) card, a SmartMedia (SM) card (SMC), a Memory Stick, an MMC (RS-MMC or MMC-micro), an SD card (e.g., SD, miniSD, microSD or SDHC), a Universal Flash Storage (UFS), and so forth.

The controller 1100 and the semiconductor memory device 100 may be integrated as one semiconductor device to configure a semiconductor drive (e.g., solid state drive (SSD)). The semiconductor drive includes a storage device configured to store data in the semiconductor memory. When the memory system 2000 is used as the semiconductor drive, an operating speed of the host Host connected to the memory system 2000 is dramatically improved.

In another example, the memory system 1000 is provided as one of various components of electronic devices, including, but not limited to, a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various electronic devices configuring a computing system.

In an embodiment, the semiconductor memory device 100 or the memory system 1000 may be mounted in various types of packages. For example, the semiconductor memory device 100 or the memory system 2000 may be packaged and mounted in the manner such as, but not limited to, a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), and so forth.

Figure 7:
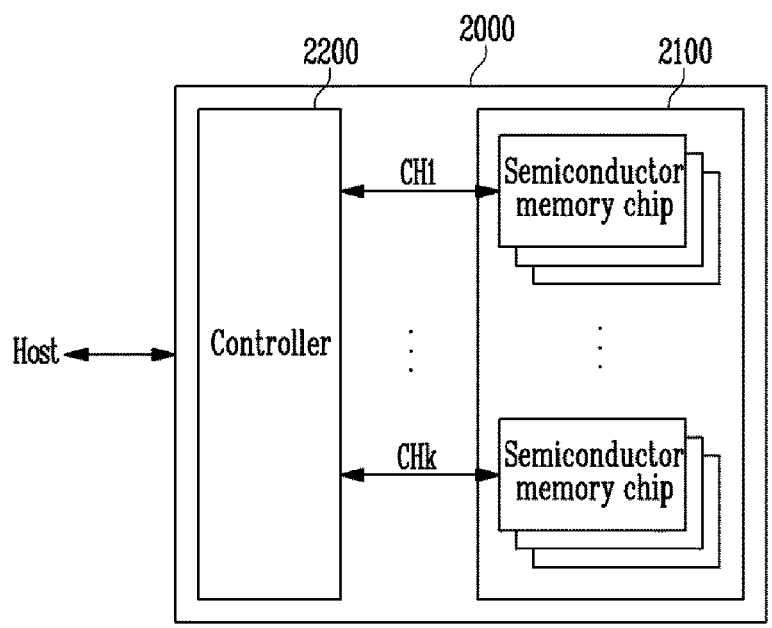
FIG. 7 is a block diagram showing an application example of the memory system of FIG. 6.

Referring to FIG. 7, the memory system 2000 includes a semiconductor memory device 2100 and a controller 2200. The semiconductor memory device 2100 includes a plurality of semiconductor memory chips. The plurality of semiconductor memory chips are further divided into a plurality of groups. Further, the controller 2200 includes a function of the controller 200 described with reference to FIG. 1.

In FIG. 7, the plurality of groups are illustrated as communicating with the controller 2200 through first to kth channels CH1 to CHk. Each semiconductor memory chip may be configured and operate like one of the semiconductor memory devices 100 described with reference to FIG. 1.

Each group is configured to communicate with the controller 2200 through a common channel. The controller 2200 is configured in a similar manner as the controller 1100 described with reference to FIG. 6 and configured to control a plurality of memory chips of the semiconductor memory device 2100 through the plurality of channels CH1 to CHk.

Figure 8:
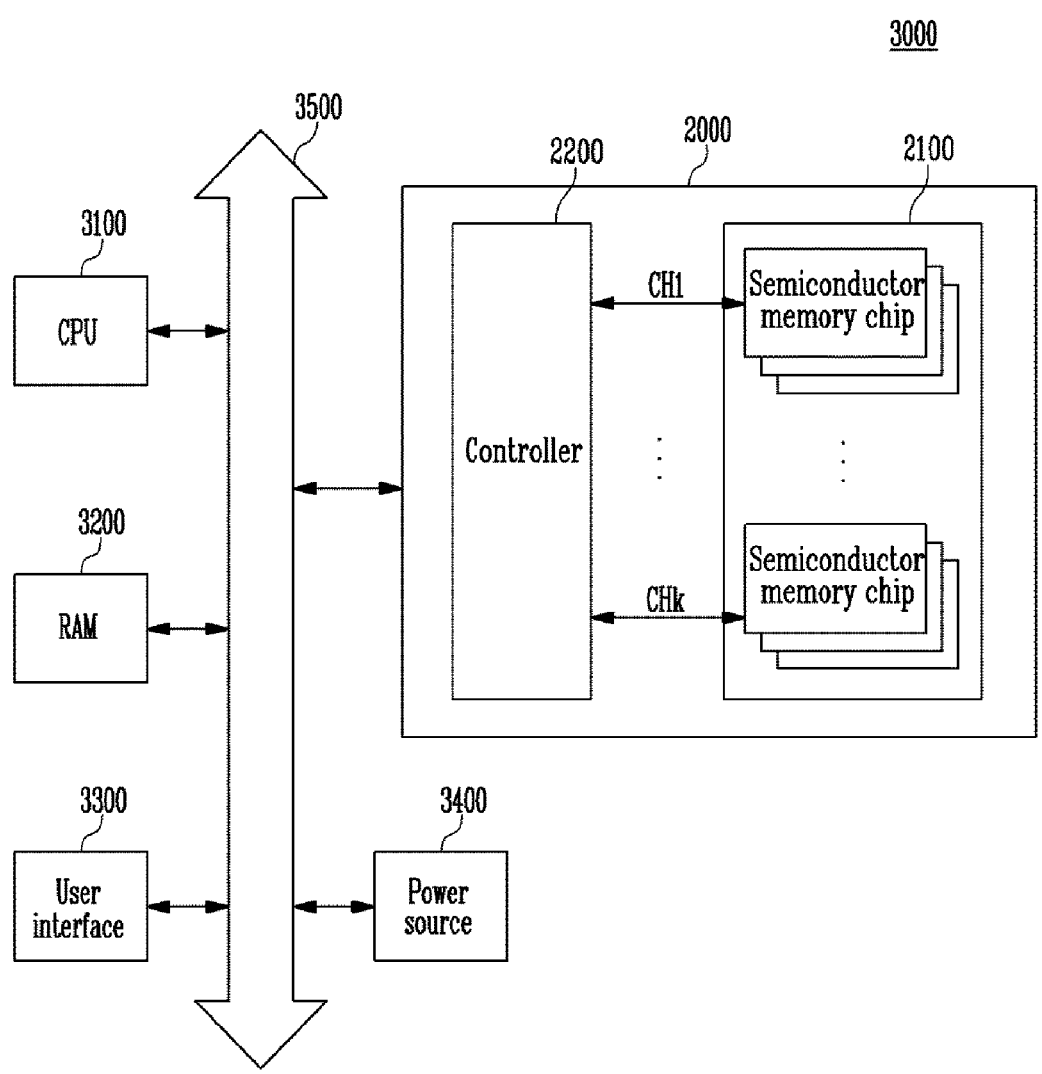
FIG. 8 is a block diagram showing a computing system including the memory system described with reference to FIG. 7.

Referring to FIG. 8, the computing system 3000 includes a central processing unit 3100, a RAM 3200, a user interface 3300, a power source 3400, a system bus 3500, and a memory system 2000.

The memory system 2000 is electrically connected to the central processing unit 3100, the RAM 3200, the user interface 3300 and the power source 3400 through the system bus 3500. Data provided through the user interface 3300 or processed by the central processing unit 3100 is stored in the memory system 2000.

In FIG. 8, the semiconductor memory device 2100 is illustrated as being connected to the system bus 3500 through the controller 2200. However, the semiconductor memory device 2100 may be directly connected to the system bus 3500. Here, a function of the controller 2200 may be performed by the central processing unit 3100 and the RAM 3200.

In FIG. 8, the memory system 2000 described with reference to FIG. 7 is illustrated. Alternatively, the memory system 2000 may be used instead of the memory system 1000 as described with reference to FIG. 6. In another embodiment, the computing system 3000 may include both the memory systems 1000 and 2000 described with reference to FIGS. 7 and 6.

According to various embodiments, when a program operation is performed, it is possible to increase and program threshold voltages of under programmed memory cells by additionally applying program voltages in which a threshold voltage of the majority of memory cells is increased to programmed states after the last program voltages using an ISPP method.

Various embodiments have been described above. Although specific terms are employed, the terms are used in a generic and descriptive sense only and not for purposes of limitation. Those skilled in the art will understand, however, that changes and modifications may be made to the embodiments without affecting the scope of the claims.

What is claimed is:

1. A semiconductor memory device, comprising:
a memory cell array including a plurality of memory cells;
peripheral circuits configured to perform:
a program operation using an incremental step pulse programming (ISPP) method on selected memory cells from among the plurality of memory cells and an additional program operation using set program voltages on set memory cells; and
a control logic configured to control the peripheral circuits to perform the program operation using the ISPP method and the additional program operation,
wherein the set program voltages comprise a first program voltage applied when a threshold voltage of a majority of the memory cells is increased to at least a target threshold voltage from among a plurality of program voltages used in the program operation using the ISPP method.

2. The semiconductor memory device of claim 1, wherein, when the program operation using the ISPP method is performed and program voltages having substantially similar potential levels as the set program voltages are applied, the set memory cells of the memory cells are verified from program fail to program pass.

3. The semiconductor memory device of claim 1, wherein the set program voltages further comprise a second program voltage increased by a step voltage from the first program voltage from among the plurality of program voltages used in the program operation using the ISPP method.

4. The semiconductor memory device of claim 1, wherein the peripheral circuits comprise:
- a voltage generator configured to generate a plurality of program voltages increased by a step voltage when the program operation using the ISPP method is performed, wherein the plurality of program voltages are increased by the set program voltages when the additional program operation is performed; and
- page buffers configured to control a potential level of a bit line connected to the memory cells based on program data when the program operation using the ISPP method is performed, wherein the page buffers classify the set memory cells when a program verification operation is performed.

5. The semiconductor memory device of claim 4, wherein the page buffers further comprise a latch configured to store information about the memory cells changed to program pass from program fail during the program verification operation after the same program voltages as the set program voltages are applied.

6. The semiconductor memory device of claim 5, wherein the set program voltages are applied to the set memory cells based on the information stored in the latch when the additional program operation is performed.

7. The semiconductor memory device of claim 1, wherein the additional program operation includes applying the set program voltages.

8. The semiconductor memory device of claim 1, wherein the peripheral circuits perform a program verification operation on the set memory cells after the program operation using the ISPP method and before the additional program operation.

9. The semiconductor memory device of claim 8, wherein the program operation using the ISPP method ends when the result of the program verification operation is pass with respect to the set memory cells, and the additional program operation is performed when the result of the program verification operation is fail.

10. A memory system, comprising:
- a semiconductor memory device configured to store program data; and
- a controller configured to receive a command from a host and to control a program operation of the semiconductor memory device;
- wherein the semiconductor memory device performs a program operation using an ISPP method and an additional program operation on set memory cells using set program voltages to store the program data,
- wherein the set program voltages comprise a first program voltage applied when a threshold voltage of a majority of a plurality of memory cells is increased to at least a target threshold voltage from among a plurality of program voltages used in the program operation using the ISPP method.

11. The memory system of claim 10, wherein the semiconductor memory device comprises:
- a memory cell array including the plurality of memory cells;
- peripheral circuits configured to perform the program operation using the ISPP method and the additional program operation when a program operation of the selected memory cells among the plurality of memory cells is performed; and
- a control logic configured to control the peripheral circuits to perform the program operation using the ISPP method and the additional program operation in response to the command received from the controller.

12. The memory system of claim 10, wherein, when the program operation using the ISPP method is performed, and the program voltages having the same potential levels as the set program voltages are applied, the set memory cells of the memory cells are verified from program fail to program pass.

13. The memory system of claim 10, wherein the set program voltage further comprise a second program voltage increased by a step voltage from the first program voltage among the plurality of program voltages used in the program operation using the ISPP method.

14. The memory system of claim 11, wherein the peripheral circuits comprise:
- a voltage generator configured to generate a plurality of program voltages increased by a step voltage when the program operation using the ISPP method is performed, wherein the plurality of program voltages are increased by the set program voltages when the additional program operation is performed; and
- page buffers configured to control a potential level of a bit line connected to the memory cells based on a program data when the program operation using the ISPP method is performed, wherein the page buffers classify the set memory cells when a program verification operation is performed.

15. The memory system of claim 14, wherein the page buffers further comprise an additional latch configured to store information about the memory cells changed to program pass from program fail during the program verification operation after the same program voltages as the set program voltages are applied.

16. The memory system of claim 15, wherein a threshold voltage is increased with respect to the set memory cells based on the information stored in the additional latch when the additional program operation is performed.

17. The memory system of claim 11, wherein the peripheral circuits perform a program verification operation on the set memory cells after the program operation using the ISPP method and before the additional program operation.

18. The memory system of claim 17, wherein the program operation ends when the result of the program verification operation is pass with respect to the set memory cells, and the additional program operation is performed when the result of the program verification operation is fail.

19. An operating method of a semiconductor memory device, comprising:
- applying program voltages to selected memory cells, and performing a program operation using an ISPP method to perform a program verification operation;
- controlling a potential level of a bit line of set memory cells among the selected memory cells when the program operation using the ISPP method ends; and
- performing an additional program operation to apply set program voltages to the set memory cells,
- wherein the set program voltages are program voltages applied when a threshold voltage of a majority of the memory cells is increased to a target threshold voltage from among a plurality of program voltages used in the program operation using the ISPP method and the set memory cells are memory cells verified from program fail to program pass when the program operation using the ISPP method is performed and the program voltages having the same potential levels as the set program voltages are applied.

* * * * *